Nov. 26, 1963 J. T. COLLINS 3,112,451
TRANSISTOR LINEAR PHASE SHIFTER
Filed Dec. 1, 1959

INVENTOR.
JAMES T. COLLINS.
BY Alden D. Redfield.
Irwin P. Garfinkle
ATTORNEYS.

1

3,112,451
TRANSISTOR LINEAR PHASE SHIFTER
James T. Collins, Cincinnati, Ohio, assignor to Avco Corporation, Cincinnati, Ohio, a corporation of Delaware
Filed Dec. 1, 1959, Ser. No. 856,553
3 Claims. (Cl. 328—155)

This invention relates to a phase shifter and, more particularly, to a transistorized phase shifter capable of producing a linear phase shift with linear variations of frequency.

In many applications, for example, in analog-to-digital converters, it may be necessary to convert a variation in frequency into a corresponding linear phase shift. In prior art linear phase shifters of this type, it has been necessary to provide lumped inductors and capacitors in conventional filter circuits. The prior art circuits are undesirable, since in each branch of the circuit the various reactive and resistive elements must be very carefully computed to provide the required phase shift for a given variation of frequency, and the reactive values in each branch differ from the values of every other branch. Furthermore, the sizes of the various inductors and capacitors must be very large to produce the required results at low audio frequencies as, for example, 25 to 75 cycles per second, and in order to construct such a circuit, special components must be used to obtain the complex, calculated values of inductances and capacitances, or else standard components must be combined. This reduces the over-all reliability and accuracy and further increases the physical size and cost of the components.

By means of this invention I propose to provide a linear phase shifter using miniaturized and reliable components capable of operating at low audio frequencies, as well as at higher frequencies.

An object of this invention is to provide a linear phase shift amplifier having improved reliability and which is capable of operation with miniaturized components at all frequencies.

Another object of this invention is to provide a transistorized phase shifter in which the inductance characteristics of the circuitry are multiplied by the current gain of the transistors and wherein the capacitance of the circuit is multiplied by the voltage gain of the transistors to produce the required phase shift with components of small inductance and capacitance.

Still another object of my invention is to provide an electronic linear phase shifter comprising a feedback-stabilized, reactance-multiplied configuration.

For additional objects and for a better understanding of the precise nature of this invention, reference should now be made to the following detailed description and to the accompanying drawing, in which.

Figure 1:
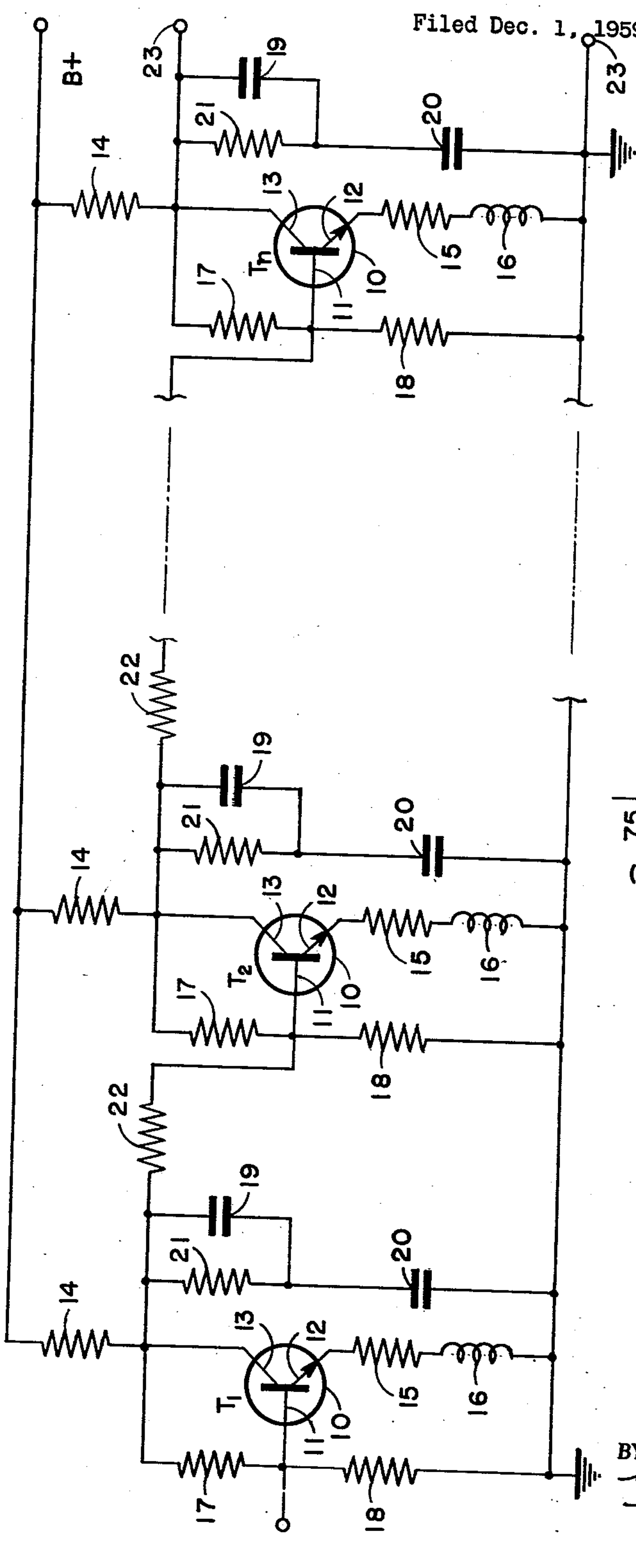
FIG. 1 represents a preferred embodiment of my linear phase shifter.

The phase shifter illustrated in FIG. 1 of the drawings comprises a plurality of similar transistor stages $T_1$, $T_2$, and $T_n$. Depending upon the particular requirements of the system, any number of such similar transistor stages may be employed. In an embodiment of this invention reduced to practice in an analog-to-digital converter, six stages, each producing a phase shift of approximately 30 degrees, were provided for yielding a 180 degree phase shift over a frequency range of 25 to 75 cycles per second.

Each transistor stage includes a transistor 10 having a base electrode 11, an emitter electrode 12, and a collector electrode 13. For appropriately biasing the electrodes of each transistor 10, the collector electrodes 13 are con-

2 nected to one terminal of a B+ supply through supply resistors 14, the other terminal being connected to ground. The emitters 12 are each connected to ground through an emitter-resistor 15 and an inductor 16. Base bias is provided by means of resistor 17 connected from the collector 13 to the base 11 and by means of resistor 18 connected from the base 11 to ground. Series-connected capacitors 19 and 20 are connected from the collector 13 to ground, a resistor 21 being connected in parallel with the capacitor 19.

The output from each stage of the phase shifter (except the last) is applied to the base of the succeeding stage through a resistor 22. The system is direct current-coupled throughout. A signal having a variable input frequency is applied between the base 11 of the first transistor stage $T_1$ and ground while a phase-shifted signal is derived from across the output terminals 23 in the last transistor stage $T_n$.

It will be noted that the parameters for the various elements in each of the stages are similar and that each stage produces approximately the same amount of phase shift. The necessary phase shifting is achieved by the effective multiplication of the inductance and capacitance in each stage. That is to say that the inductance in each stage is effectively multiplied by the transistor current gain, and the capacitance in each stage is effectively multiplied by the transistor voltage gain.

These results are accomplished by the use of the novel reactive feedback circuit illustrated, providing good stabilization and the cascading of the various stages. The stabilizing and reactive feedback is obtained by means of both parallel and series networks in combination; that is, the inductor 16 in the emitter circuit of each transistor is in series with the emitter-collector junctions, thus providing a series-reactive feedback path while the resistors 17 are in parallel with the collector-emitter junctions at the transistors, thus providing a parallel direct current feedback path from the output circuit of each stage to the input circuit.

With the stabilizing and reactive feedback arrangement as illustrated, the apparent inductance looking into the base of each transistor is much higher than the actual inductance, since the emitter current is much greater than the base current. Therefore, an increase in the reactance value of the inductor 16 resulting from an increase in frequency will result in an amplified decrease in emitter current. The reactance multiplication is stabilized by both direct current and alternating current feedback networks. These are necessary to facilitate use of commercial components, since they tend to reduce the normal span of tolerances.

The inductor 16 may have a low Q, the resistors 15 and 21 being provided to minimize the Q variations.

While this invention is not limited to any particular circuit parameters or number of stages, the following were incorporated in an embodiment of this invention successfully tested and reduced to practice, and they are listed as an aid to reconstructing this invention:

| | | |
|---|---|---|
| Transistor 10 | | Type 2N35. |
| Resistor 14 | ohms | 10K |
| Resistor 15 | do | 100 |
| Resistor 17 | do | .82K |
| Resistor 18 | do | 4.7K |
| Resistor 21 | do | 3.9K |
| Resistor 22 | do | 56K |
| Inductor 16 | h | .6 |
| Capacitor 19 | $\mu f$ | .39 |
| Capacitor 20 | $\mu f$ | .39 |

Figure 2:
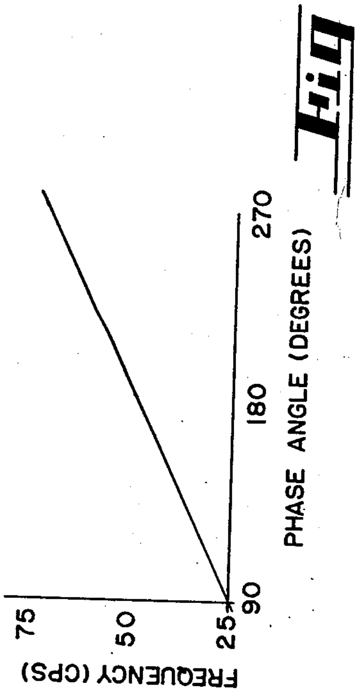
FIG. 2 is a curve illustrating the performance of a linear phase shifter reduced to practice in accordance with the teachings of my invention.

The approximate results realized by my invention are illustrated in FIG. 2 wherein it is shown that over a frequency range of 25 to 75 cycles per second, a phase shift of 90 to 270 degrees was obtained. The realized linearity was in the order of 3%, representing a vast improvement over prior art phase shifters.

I have produced, by means of this invention, a phase shifter having good linearity and enabling a reduction in size with increased value in the order of 10 to 1, as compared with prior art devices. By using conventional and time-tested components under conditions tending to give long life operation, the reliability of the system has also been greatly improved; on the contrary, the known conventional phase shifters require special components having great problems of reliability.

While I have described a paritcular embodiment of this invention designed for producing a given phase shift over a given frequency range and having particular use in an analog-to-digital converter, it should be apparent to one skilled in the art that this invention may be used over any frequency range within the limits of the transistors, and that it is adaptable to many other uses. It is my intention, therefore, that this invention be limited only by the appended claims as read in the light of the prior art.

I claim:

1. An electronic linear phase shifter comprising a plurality of substantially identical cascaded transistor stages, each of said stages including a transistor having a base, an emitter, and a collector electrode and having an input circuit between said base and said emitter electrode, and an output circuit between said emitter and said collector electrode, an inductive impedance connected to said emitter in a circuit common to said input circiut and said output circuit, a capacitive impedance connected across said output circuit, and direct current feedback means connected from said output circuit to said input circuit; an alternating current source variable in frequency between predetermined limits connected across the input circuit of the first of said stages, and direct current coupling means for connecting the output circuit of each of said transistor stages to the input circuit of a succeeding transistor stage.

2. An electronic linear phase shifter comprising: a plurality of substantially identical cascaded transistor stages, each of said stages including a transistor having a base, an emitter, and a collector electrode, an input circuit for each of said transistor stages, an output circuit for each of said transistor stages, an alternating current signal source variable in frequency between predetermined limits applied across the input circuit of the first of said stages, an inductive feedback path in each of said stages, said inductive path being common to said input circuit and to said output circuit for providing a series feedback from said output circuit to said input circuit, a capacitive network in said output circuit, and parallel direct current-coupled feedback means from said capacitive network in said output to said input circuit.

3. An electronic linear phase shifter comprising: a source of direct current potential, said source having first and second terminals, said first terminal being connected to a point of reference potential; a plurality of substantially identical transistor stages, each of said stages including a transistor having a base, an emitter, and a collector electrode, said collector electrode being connected to said second terminal of said source, an inductor connected between said emitter electrode and said point of reference potential, first and second series-connected capacitors connected between said collector and said point of reference potential, and a feedback resistor connected between said collector and said base; an alternating current signal source variable in frequency between predetermined limits connected between the base of said transistor in the first of said transistor stages and said point of reference potential, and means connecting the collector of said transistor of each of said stages to the base of a succeeding stage; and means for deriving an output from between the collector of the transistor in the last of said stages and said point of reference potential.

References Cited in the file of this patent

UNITED STATES PATENTS

| | | |
|---|---|---|
| 2,231,955 | Schrader | Feb. 18, 1941 |
| 2,566,333 | Huntoon | Sept. 4, 1951 |
| 2,989,628 | Horgan | June 20, 1961 |